United States Patent [19]

Song

[11] Patent Number: 5,113,144
[45] Date of Patent: May 12, 1992

[54] FEED-BACK TYPE EMPHASIS CIRCUIT

[75] Inventor: Young W. Song, Seoul, Rep. of Korea

[73] Assignee: Goldstar Electron Co., Ltd., Chungcheongbuk, Rep. of Korea

[21] Appl. No.: 601,870

[22] Filed: Oct. 22, 1990

[30] Foreign Application Priority Data

Oct. 23, 1989 [KR] Rep. of Korea ............... 89-15410

[51] Int. Cl.⁵ .................... H03F 1/34; H03F 3/68
[52] U.S. Cl. ............................ 330/85; 330/302; 330/310
[58] Field of Search .............. 330/85, 107, 252, 258, 330/302, 303, 304, 305, 306, 293, 310

[56] References Cited

U.S. PATENT DOCUMENTS 4,291,276 9/1981 Ida .............................. 330/85
4,468,627 8/1984 Fushiki ....................... 330/304 X Primary Examiner—Steven Mottola
Attorney, Agent, or Firm—Blakely, Sokoloff, Taylor & Zafman

[57] ABSTRACT

A feed-back type emphasis circuit is disclosed which comprises an input amplifier, a low pass filter, an output amplifier and a feed-back amplifier. The input amplifier receives an input through its positive terminal, and the low pass filter receives the output of the input amplifier, and supplies its output to both the output amplifier and the feed-back amplifier. The output amplifier receives the output of the low pass filter and the input from the outside, while the feed-back amplifier receives both the output of the low pass filter and the input from the outside, with the polarities of its input terminals being shiftable correspondingly with the system specification of the set. The feedback amplifier includes a differential amplifier with adjustable gain and balance for two inputs, whereby the amount of emphasis can be adjusted and the circuit of the present invention can satisfy any specification, thus no new circuit is required when the specification is changed.

1 Claim, 4 Drawing Sheets

FEED-BACK TYPE EMPHASIS CIRCUIT

FIELD OF THE INVENTION

The present invention relates to a feed-back type emphasis circuit in which the output gain as against the input is increased according as the frequency of the input signals is increased, and particularly to an emphasis circuit in which the emphasis characteristics can be variably constituted by simply changing the circuital connection and the value of resistor without the new circuital constitution depending on the set or system adopted.

BACKGROUND OF THE INVENTION

The conventional amplifier circuit as shown in FIG. 1 is useful from audio frequencies to several MegaHertz. It comprises an amplifier (A) 100 and a low pass filter (LPF) 103 which consists of a resistance R4 and a condenser C1, and inputs $V_i$ are fed into a positive side of amplifier A and into the input side of low pass filter LPF, while the output side of the low pass filter LPF is connected to a negative side of amplifier A.

The conventional circuit constituted as above is operated in the following manner.

The characteristics of the output $V_o$ as against the input $V_i$, i.e., the transfer characteristics can be calculated based on the following formula:

$$V_o = (V_i - L_p V_i) \cdot G_o \qquad (1)$$

where $L_p$ represents a transfer characteristic function of LPF, and $G_o$ represents the gain of output amplifier 100.

Formula 1 can be rewritten:

$$V_o/V_i = (1 - L_p) \cdot G_o \qquad (2)$$

The transfer characteristics function $L_p$ for the low pass filter LPF can be calculated based on the following formula:

$$L_p = \frac{1}{1 + j(f/f_c)} \qquad f_c = \frac{1}{2\pi RC} \qquad (3)$$

Formula 3 can be substituted into Formula 2 to obtain the following formula:

$$\frac{V_o}{V_i} = \frac{j(f/f_c)}{1 + j(f/f_c)} \cdot G_o \qquad (4)$$

In the conventional circuit, the transfer characteristics at $f = f_c$ is $1/\sqrt{2}$ as can be seen by Formula 4 and FIG. 2.

Here, it is noted that the emphasis circuit shown in FIG. 1 has the transfer characteristics of Formula 4, and the gain characteristics for different frequencies can be expressed as shown in FIG. 2.

Therefore, as shown in FIG. 2, the emphasis circuit operates in such a manner that, the higher the frequency (f) of the signals, the greater the gain.

When a recording is carried out on a VCR tape by FM-modulating the luminance signals using the emphasis circuit of FIG. 1, the noise components are recorded in a higher level proportional to the frequency. To improve the S/N(signal/noise) characteristics during a playing, the luminance signals are emphasized during the recording.

The level of the emphasis as against the frequency is determined by a standard specification, but the specification can be changed in order to vary the quantity of the emphasis for the purpose of improving the picture quality. The conventional circuit cannot be easily adjusted for a new specification, and generally must be redesigned and rewired.

SUMMARY OF THE INVENTION

The present invention is intended to overcome the above described limits of the conventional circuit.

The present circuit provides feed-back type emphasis using an input amplifier, a low pass filter, an output amplifier and a feed-back amplifier. The input amplifier receives an input through its positive terminal, and the low pass filter receives the output of the input amplifier, and supplies its output to both the output amplifier and the feed-back amplifier. The output amplifier receives the output of the low pass filter and the original input, while the feed-back amplifier receives both the output of the low pass filter and the original input, with the polarities of its input terminals being shiftable correspondingly with the system specification of the set. By adjusting the relative gain of each input or the differential between inputs of the feedback amplifier, the circuit of the present invention can satisfy any specification and avoid designing a new circuit when the specification is changed.

Therefore it is the object of the present invention to provide a feed-back type emphasis in which the emphasis quantity can be varied to fit changed specifications, thereby avoiding the need for a new circuit.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
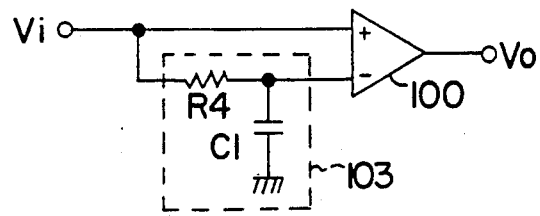
FIG. 1 is an illustration of a conventional emphasis circuit.
Figure 2:
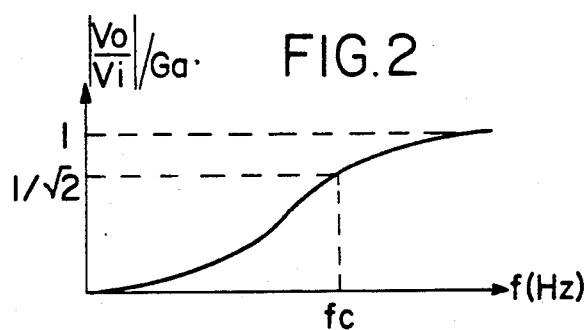
FIG. 2 illustrates the frequency characteristics of the conventional emphasis circuit.
Figure 3:
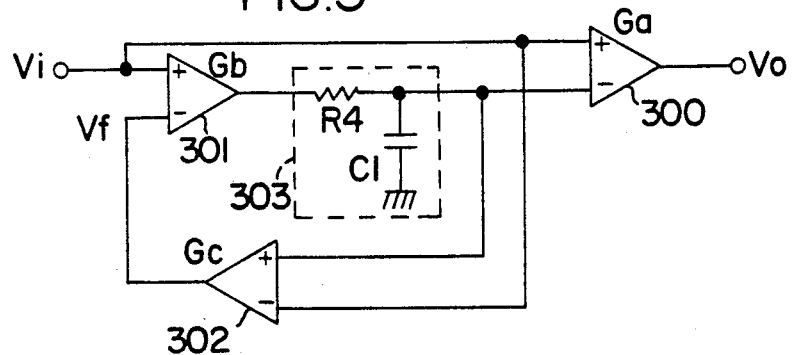
FIGS. 3 and 4 are illustrations of the feed-back type emphasis circuit according to the present invention.
Figure 4:
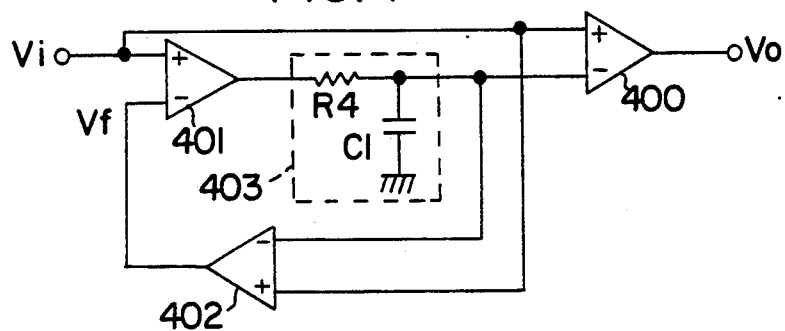

As shown in FIGS. 3 and 4, the feed-back type emphasis circuit according to the present invention comprises: three operational amplifiers 300, 301 and 302 and a low pass filter LPF 303 consisting of a resistance R4 and a condenser C1.

According to FIG. 3, an input terminal $V_i$ is connected to the positive sides of output amplifier 300 and input amplifier 301, and to the negative input side of feed-back amplifier 302. The output of input amplifier 301 is connected to the input of the low pass filter (LPF) 301, and the output of the LPF 301 is connected to the negative side of output amplifier 301 and to the positive side of feed-back amplifier 302, while the output side of feed-back amplifier 302 is connected to the negative side of input amplifier 301, providing signal $V_f$. The output $V_o$ of output amplifier 300 is the final output.

According to FIG. 4 which illustrates another embodiment of the circuit of the present invention, the negative side of feed-back amplifier 402 is connected to both the output side of low pass filter (LPF) 403 and the input of output amplifier 400, and the positive input of feedback amplifier 402 is connected to the positive input of input amplifier 401 and input $V_i$.

Figure 5:
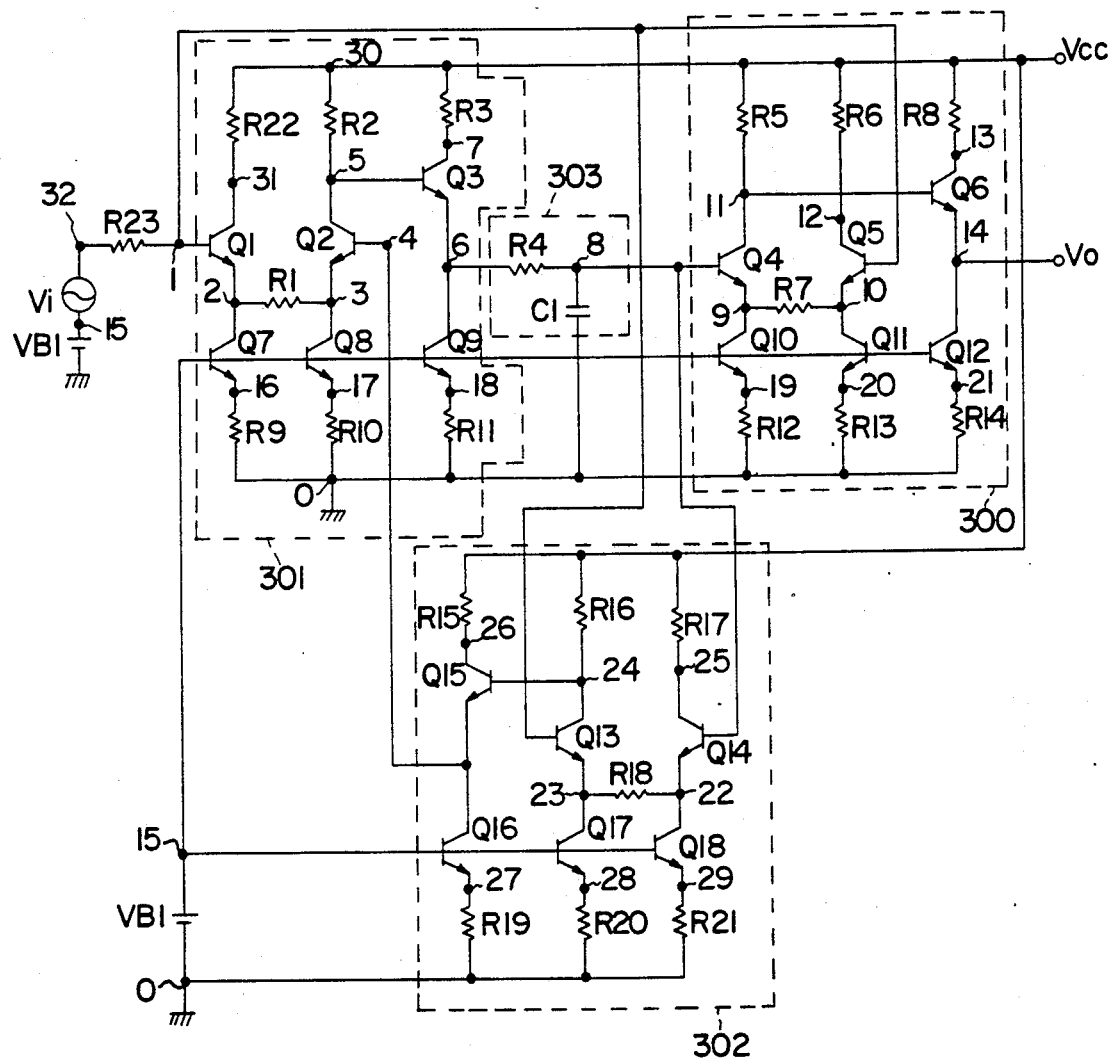
FIG. 5 is a detailed illustration of the circuit in FIG. 3.
Figure 6:
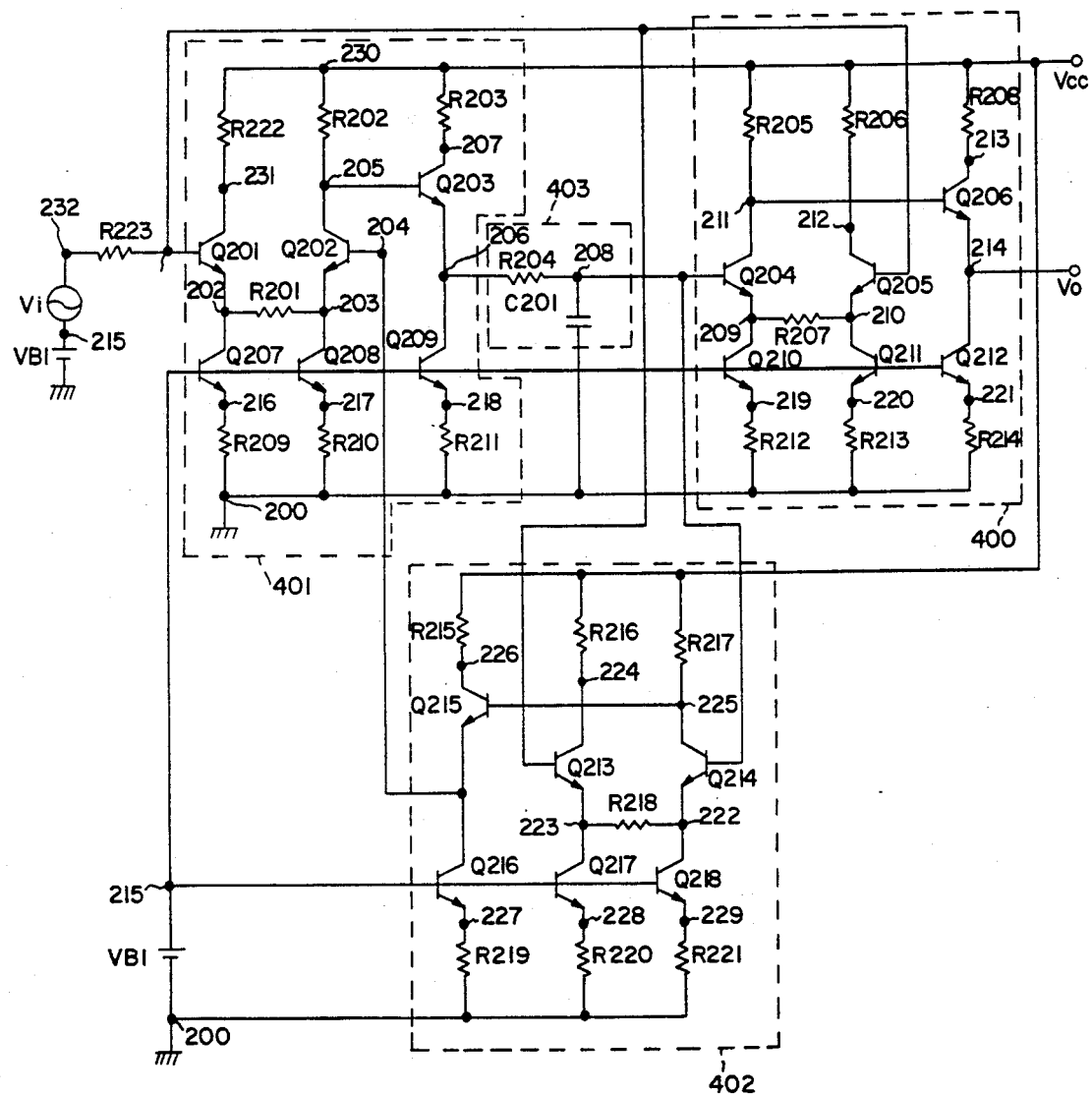
FIG. 6 is a detailed illustration of the circuit in FIG. 4.

FIG. 5 is a detailed illustration of the circuit of FIG. 3, while FIG. 6 is a detailed illustration of the circuit of FIG. 4.

The transfer characteristics of the circuit of FIG. 3 can be obtained in the following manner.

First, an equation for the path covering input amplifier 301, the low pass filter (LPF) 303 and feed-back amplifier 302 can be defined as follows:

$$\{(V_i - V_f) \, G_i L_p - V_i\} \cdot G_r = V_f \quad (5)$$

where $G_i$ represents the gain of input amplifier 301, and $G_f$ is the gain of feedback amplifier 302.

Formula 5 is applicable to the case where the positive input side of feed-back amplifier 302 is connected to the output side of the low pass filter LPF 303, and the negative input side of amplifier 302 is connected to the original input, $V_i$.

However, in the case of the opposite polarity shown in FIG. 4, that is, in the case where the positive input side of feed-back amplifier 402 is connected to the input terminal $V_i$, and the negative input side of amplifier 402 is connected to the output side of the low pass filter 403, the left side of Formula 5 has only to be multiplied by $-1$.

Formula 5 can be calculated for $V_f$ as follows:

$$V_f = \frac{G_i \cdot L_p - 1}{G_i \cdot L_p + 1/G_f} \cdot V_i \quad (6)$$

$$V_o = \{V_i - (V_i - V_f) \, G_i L_p\} \cdot G_o \quad (7)$$

where $G_o$ represents the gain of output amplifier 302. Formula 6 can be substituted into Formula 7 as follows:

$$\frac{V_o}{V_i} = \left\{1 - \left(1 - \frac{G_i L_p - 1}{G_i L_p + \frac{1}{G_f}}\right) G_i \cdot L_p \right\} G_o = \quad (8)$$

$$\frac{1 - G_i L_p}{1 + G_f G_i L_p} \cdot G_o$$

Formula 8 can be further arranged by substituting it into Formula 3 as follows:

$$\frac{V_o}{V_i} = \frac{(1 - G_i) + j(f/f_c)}{(1 + G_i G_f) + j(f/f_c)} \cdot G_o \quad (9)$$

If the gain $G_i$ of input amplifier 301 (or 401) is set to be 1, then the following formula can be obtained:

$$\frac{V_o}{V_i} = \frac{j(f/f_c)}{1 + G_f + j(f/f_c)} \cdot G_o \quad (10)$$

Figure 7:
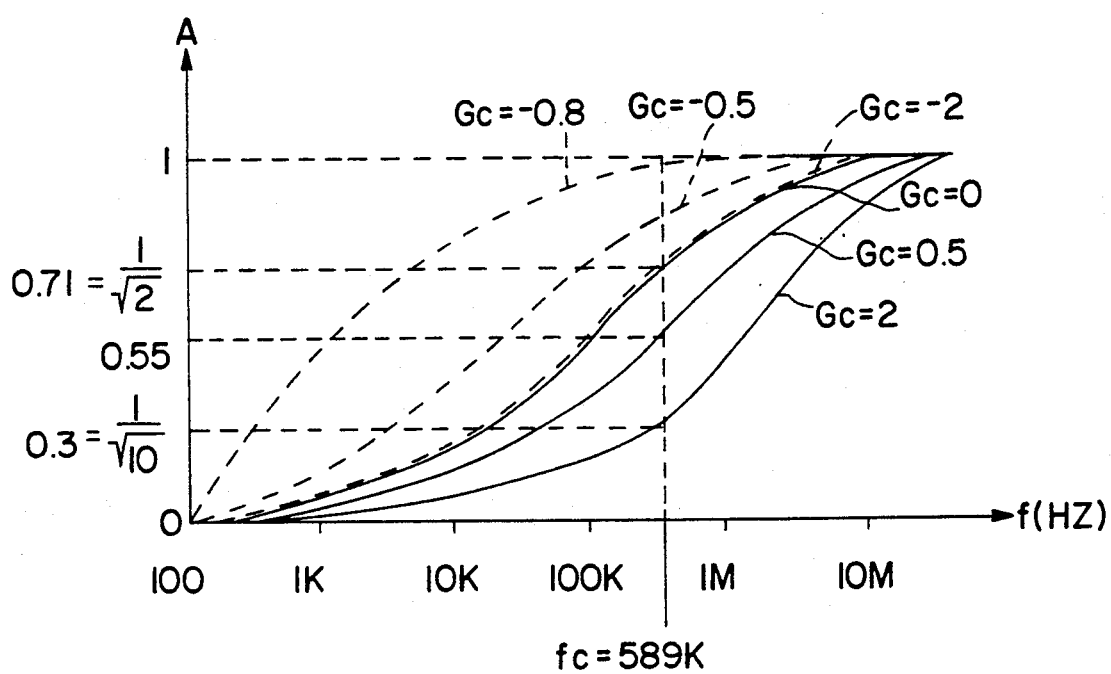
FIG. 7 is a graphical illustration of the frequency characteristics of the feed-back type emphasis circuit according to the present invention.

The transfer characteristics for frequency in Formula 10 become as shown in FIG. 7 where the gain is increased as the frequency is increased, thereby realizing an emphasizing operation. The sign of $G_f$ in Formula 10 is reversed for the circuit of FIG. 6. The gain of $G_f$ of the feedback amplifier can be adjusted by changing R18, changing voltage $V_{15}$, by adjusting R16, R17, R20 and R20, or by a combination of these changes.

The emphasis characteristics in FIG. 7 can be changed by modifying $G_f$ of feedback amplifier 302 or 402. The value of $G_f$ for the circuit in FIG. 5 is $$G_f = \frac{R16}{2(\gamma_e)} + R18 \quad (11)$$

The same formula applies for the circuit in FIG. 6 except R16 is replaced by R17.

To vary the emphasis characteristics for the circuit in FIG. 5, R16, R18 and the value of $\gamma_e$ of transistors Q13 and Q14 can be varied. The gamma of those transistors depends upon the collector current and is therefore affected by choosing appropriate value of R20, R21 and the voltage on node 15.

Resistance R18 affects the dynamic range and Common Mode Rejection Ratio (CMRR) of the differential amplifier at the front end of the feedback amplifier, and therefore must be selected or adjusted according to methods well known to those skilled in the art within a range which will not introduce undesirable characteristics in the circuit.

The circuit of this invention allows modifying the emphasis characteristics to meet a desired specification for a certain amount of feedback while the frequency f can be adjusted by modifying the RC values of the low pass filter.

EXAMPLES

The following examples show the simulation states of the feed-back type emphasis circuit according to the present invention by changing, for example, the value of R18, with a resulting change in $G_f$ of the feedback amplifiers as well as gain characteristics of $V_o/V_i$ in equation 10.

Simulations 1 and 2 apply to FIG. 5 in which the base of transistor 215 is connected to node 25, while Simulations 3 and 4 apply to FIG. 6 in which the base of the transistor 215 is connected to node 224. The simulations include AC analysis which shows a variation of the output voltage $V_0$ as against the increase of the frequency FREQ of $V_i$, i.e., the variation of the voltage $V_{14}$ (the voltage at node 14) in response to input $V_i$, at node 2.

What is claimed is:
1. A feed-back type emphasis circuit comprising: an input providing input signal $V_i$, an input amplifier having two input terminals and an output terminal, a low pass filter having an input and an output, an output amplifier having two input terminals and an output terminal and a feed-back amplifier having two input terminals and an output terminal, said input amplifier receiving said input $V_i$ through a first one of said input terminals;

the input of said low pass filter connected to the output terminal of said input amplifier, and the output of the low pass filter connected both to a first one of said input terminals of said output amplifier and to a first one of said input terminals of said feed-back amplifier;

said output amplifier connected to said input signal $V_i$ through the second of its said two input terminals;

said feed-back amplifier connected to said input signal $V_i$ through the second of its said two input terminals; and said feed-back amplifier further comprising a differential amplifier with adjustable gain and balance between two inputs to said differential amplifier, whereby the feedback amplifier can be adjusted to obtain a specified transfer function for the emphasis circuit.

* * * * *